US006248503B1

(12) United States Patent
Vermeersch et al.

(10) Patent No.: US 6,248,503 B1
(45) **Date of Patent: *Jun. 19, 2001**

(54) METHOD FOR MAKING POSITIVE WORKING PRINTING PLATES FROM A HEAT MODE SENSITIVE IMAGING ELEMENT

(75) Inventors: Joan Vermeersch, Deinze; Marc Van Damme, Heverlee, both of (BE); Andreas Elsässer, Idstein (DE); Inge Claes, Kessel (BE)

(73) Assignee: Agfa-Gevaert, Mortsel (BE)

( * ) Notice: Subject to any disclaimer, the term of this patent is extended or adjusted under 35 U.S.C. 154(b) by 0 days.

This patent is subject to a terminal disclaimer.

(21) Appl. No.: 09/186,613

(22) Filed: Nov. 6, 1998

Related U.S. Application Data

(60) Provisional application No. 60/070,715, filed on Jan. 7, 1998.

(30) Foreign Application Priority Data

Nov. 7, 1997 (EP) .................................................. 97203466

(51) Int. Cl.$^{7}$ ..................................................... G03F 7/004

(52) U.S. Cl. ......................................... 430/302; 101/463.1

(58) Field of Search ................................. 430/270.1, 302; 101/454, 457, 463.1, 465

(56) References Cited

U.S. PATENT DOCUMENTS

| | | | | |
|---|---|---|---|---|
| 3,619,157 | | 11/1971 | Brinckman . | |
| 4,339,530 | * | 7/1982 | Sprintschnik et al. | 430/331 |
| 5,340,699 | * | 8/1994 | Haley et al. | 430/302 |
| 5,536,619 | * | 7/1996 | Verburgh | 430/273.1 |
| 5,840,467 | * | 11/1998 | Kitatani et al. | 430/302 |
| 5,858,604 | * | 1/1999 | Takeda et al. | 430/162 |
| 5,958,655 | * | 9/1999 | Miller et al. | 430/331 |
| 6,004,728 | * | 12/1999 | Deroover et al. | 430/302 |
| 6,060,222 | * | 5/2000 | West et al. | 430/326 |
| 6,152,036 | * | 11/2000 | Verschueren et al. | 101/457 |

FOREIGN PATENT DOCUMENTS

| | | |
|---|---|---|
| 0 347 245 | 12/1989 | (EP) . |
| 1155035 | 6/1969 | (GB) . |
| 1160221 | 8/1969 | (GB) . |
| 1 208 415 | 10/1970 | (GB) . |
| 1 245 924 | 9/1971 | (GB) . |

* cited by examiner

*Primary Examiner*—Hoa Van Le
*Assistant Examiner*—Barbara Gilmore
(74) *Attorney, Agent, or Firm*—Breiner & Breiner

(57) ABSTRACT

According to the present invention there is provided a method for making a lithographic printing plate comprising the steps of a) exposing imagewise to IR-radiation a heat mode imaging element having on a lithographic base with a hydrophilic surface a first layer including a polymer, soluble in an aqueous alkaline solution and a top layer on the same side of the lithographic base as the first layer which top layer is unpenetrable by an alkaline developer and contains a compound capable of converting light into heat, wherein said first layer and said top layer may be one and the same layer; and b) developing said imagewise exposed heat mode imaging element with said alkaline developer whereby the exposed areas of the first and the top layer, which may be the same, are dissolved and the unexposed areas of the first layer remain undissolved characterized in that said alkaline developer has a pH of at least 12 and a surface tension of at least 30 mN/m.

14 Claims, No Drawings

METHOD FOR MAKING POSITIVE WORKING PRINTING PLATES FROM A HEAT MODE SENSITIVE IMAGING ELEMENT

This application claims benefit of U.S. Provisional Application No. 60/070,715 filed Jan. 7, 1998.

FIELD OF THE INVENTION

The present invention relates to a method for preparing a lithographic printing plate using a heat mode imaging element whereby the capacity of the top layer of being penetrated and/or solubilized by an aqueous developer is changed upon exposure.

More specifically the invention is related to a method for preparing a lithographic printing plate using a heat mode imaging element by developing with an alkaline solution having a pH of at least 12 and a surface tension of at least 30 mN/m.

BACKGROUND OF THE INVENTION

Lithography is the process of printing from specially prepared surfaces, some areas of which are capable of accepting lithographic ink, whereas other areas, when moistened with water, will not accept the ink. The areas which accept ink form the printing image areas and the ink-rejecting areas form the background areas.

In the art of photolithography, a photographic material is made imagewise receptive to oily or greasy inks in the photo-exposed (negative-working) or in the non-exposed areas (positive-working) on a hydrophilic background.

In the production of common lithographic printing plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers. Particularly diazo-sensitized systems are widely used.

Upon imagewise exposure of the light-sensitive layer the exposed image areas become insoluble and the unexposed areas remain soluble. The plate is then developed with a suitable liquid to remove the diazonium salt or diazo resin in the unexposed areas.

Alternatively, printing plates are known that include a photosensitive coating that upon image-wise exposure is rendered soluble at the exposed areas. Subsequent development then removes the exposed areas. A typical example of such photosensitive coating is a quinone-diazide based coating.

Typically, the above described photographic materials from which the printing plates are made are camera-exposed through a photographic film that contains the image that is to be reproduced in a lithographic printing process. Such method of working is cumbersome and labor intensive. However, on the other hand, the printing plates thus obtained are of superior lithographic quality.

Attempts have thus been made to eliminate the need for a photographic film in the above process and in particular to obtain a printing plate directly from computer data representing the image to be reproduced. However the photosensitive coating is not sensitive enough to be directly exposed with a laser. Therefor it has been proposed to coat a silver halide layer on top of the photosensitive coating. The silver halide may then directly be exposed by means of a laser under the control of a computer. Subsequently, the silver halide layer is developed leaving a silver image on top of the photosensitive coating. That silver image then serves as a mask in an overall exposure of the photosensitive coating. After the overall exposure the silver image is removed and the photosensitive coating is developed. Such method is disclosed in for example JP-A- 60- 61 752 but has the disadvantage that a complex development and associated developing liquids are needed.

GB-1 492 070 discloses a method wherein a metal layer or a layer containing carbon black is provided on a photosensitive coating. This metal layer is then ablated by means of a laser so that an image mask on the photosensitive layer is obtained. The photosensitive layer is then overall exposed by UV-light through the image mask. After removal of the image mask, the photosensitive layer is developed to obtain a printing plate. This method however still has the disadvantage that the image mask has to be removed prior to development of the photosensitive layer by a cumbersome processing.

Furthermore methods are known for making printing plates involving the use of imaging elements that are heat-sensitive rather than photosensitive. A particular disadvantage of photosensitive imaging elements such as described above for making a printing plate is that they have to be shielded from the light. Furthermore they have a problem of sensitivity in view of the storage stability and they show a lower resolution. The trend towards heat mode printing plate precursors is clearly seen on the market.

For example, Research Disclosure no. 33303 of January 1992 discloses a heat mode imaging element comprising on a support a cross-linked hydrophilic layer containing thermoplastic polymer particles and an infrared absorbing pigment such as e.g. carbon black. By image-wise exposure to an infrared laser, the thermoplastic polymer particles are image-wise coagulated thereby rendering the surface of the imaging element at these areas ink-acceptant without any further development. A disadvantage of this method is that the printing plate obtained is easily damaged since the non-printing areas may become ink accepting when some pressure is applied thereto. Moreover, under critical conditions, the lithographic performance of such a printing plate may be poor and accordingly such printing plate has little lithographic printing latitude.

U.S. Pat. No. 4,708,925 discloses imaging elements including a photosensitive composition comprising an alkali-soluble novolac resin and an onium-salt. This composition may optionally contain an IR-sensitizer. After image-wise exposing said imaging element to UV—visible—or IR-radiation followed by a development step with an aqueous alkali liquid there is obtained a positive or negative working printing plate. The printing results of a lithographic plate obtained by irradiating and developing said imaging element are poor.

EP-A- 625 728 discloses an imaging element comprising a layer which is sensitive to UV- and IR-irradiation and which may be positive or negative working. This layer comprises a resole resin, a novolac resin, a latent Bronsted acid and an IR-absorbing substance. The printing results of a lithographic plate obtained by irradiating and developing said imaging element are poor.

U.S. Pat. No. 5,340,699 is almost identical with EP-A-625 728 but discloses the method for obtaining a negative working IR-laser recording imaging element. The IR-sensitive layer comprises a resole resin, a novolac resin, a latent Bronsted acid and an IR-absorbing substance. The printing results of a lithographic plate obtained by irradiating and developing said imaging element are poor.

Furthermore EP-A- 678 380 discloses a method wherein a protective layer is provided on a grained metal support underlying a laser-ablatable surface layer. Upon image-wise exposure the surface layer is fully ablated as well as some parts of the protective layer. The printing plate is then treated with a cleaning solution to remove the residu of the protective layer and thereby exposing the hydrophilic surface layer.

EP-A- 97 200 588.8 discloses a heat mode imaging element for making lithographic printing plates comprising on a lithographic base having a hydrophilic surface an intermediate layer comprising a polymer, soluble in an aqueous alkaline solution and a top layer that is sensitive to IR-radiation wherein said top layer upon exposure to IR-radiation has a decreased or increased capacity for being penetrated and/or solubilized by an aqueous alkaline solution.

Said polymer soluble in an alkaline solution is preferably a novolac. The image differentation between exposed and non exposed materials is based on an increased wettability or penetration on the exposed areas. It was observed that the properties of the obtained lithographic plate were deficient in many cases certainly regarding the dot rendering, making said plates unsuitable for high quality printing. So an amelioration of said property is requested.

OBJECTS OF THE INVENTION

It is an object of the invention to provide a method for making positive lithographic printing plates from a heat mode sensitive imaging element having excellent printing properties, especially dot rendering, developable in a selective, rapid, convenient and ecological way.

It is further an object of the present invention to provide a method for making positive lithographic printing plates from a heat mode sensitive imaging element having a high infrared sensitivity.

It is also an object of the present invention to provide a method for making positive lithographic printing plates from a heat mode sensitive imaging element wich may be imaged by laser exposure at short as well as at long pixel dwell times.

Further objects of the present invention will become clear from the description hereinafter.

SUMMARY OF THE INVENTION

According to the present invention there is provided a method for making a lithographic printing plate comprising the steps of a) exposing imagewise to IR-radiation a heat mode imaging element having on a lithographic base with a hydrophilic surface a first layer including a polymer, soluble in an aqueous alkaline solution and a top layer on the same side of the lithographic base as the first layer which top layer is unpenetrable by an alkaline developer and contains a compound capable of converting light into heat, wherein said first layer and said top layer may be one and the same layer; and b) developing said imagewise exposed heat mode imaging element with said alkaline developer whereby the exposed areas of the first and the top layer, which may be the same, are dissolved and the unexposed areas of the first layer remain undissolved characterized in that said alkaline developer has a pH of at least 12 and a surface tension of at least 30 mN/m.

DETAILED DESCRIPTION OF THE INVENTION

According to the present invention there is provided a method for making a lithographic printing plate comprising the steps of a) exposing imagewise to IR-radiation a heat mode imaging element having on a lithographic base with a hydrophilic surface a first layer including a polymer, soluble in an aqueous alkaline solution and a top layer on the same side of the lithographic base as the first layer which top layer is unpenetrable by an alkaline developer and contains a compound capable of converting light into heat, wherein said first layer and said top layer may be one and the same layer; and b) developing said imagewise exposed heat mode imaging element with said alkaline developer whereby the exposed areas of the first and the top layer, which may be the same, are dissolved and the unexposed areas of the first layer remain undissolved characterized in that said alkaline developer has a pH of at least 12 and a surface tension of at least 30 mN/m.

The top layer is also called the second layer.

In a first group of embodiments the first layer and the top layer are different. In a first embodiment there is provided a method for making lithographic printing plates including the following steps:

a) preparing a heat mode imaging element having on a lithographic base with a hydrophilic surface a first layer including a polymer, soluble in an aqueous alkaline solution and a top layer on the same side of the lithographic base as the first layer which top layer is sensitive to IR-radiation and which is unpenetrable for an alkaline developer;

b) exposing imagewise said heat mode imaging element to IR-radiation;

c) developing said imagewise exposed heat mode imaging element with said alkaline developer so that the exposed areas of the top layer and the underlying areas of the first layer are dissolved and the unexposed areas of the first layer and the second layer remain undissolved, characterized in that said top layer includes an IR-dye or carbon black.

The top layer, in accordance with the present invention comprises an IR-dye and a binder resin. A mixture of IR-dyes may be used, but it is preferred to use only one IR-dye. Preferably said IR-dyes are IR-cyanines dyes. Particularly useful IR-cyanine dyes are cyanines dyes with two acid groups, more preferably with two sulphonic groups. Still more preferably are cyanines dyes with two indolenine and two sulphonic acid groups. Most preferably is compound I with the structure as indicated (I)

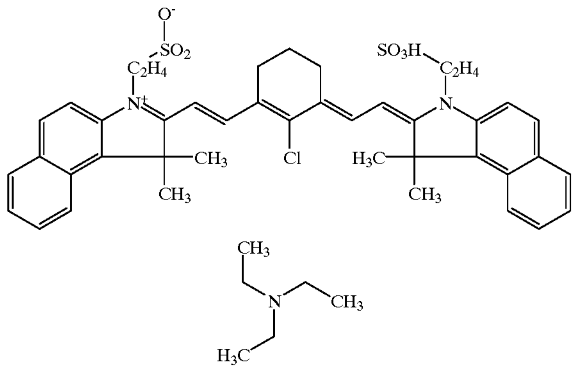

The top layer may preferably comprise as binder a water insoluble polymer such as a cellulose ester, a copolymer of vinylidene chloride and acrylonitrile, poly(meth)acrylates, polyvinyl chloride, silicone resins, etc.

The ratio between the total amount of IR-cyanine dyes and resin binder preferably ranges from 1:99 to 100:0, more preferably from 5:95 to 95:5. The total amount of the top layer preferably ranges from 0.1 to 10 g/$m^2$ more preferably from 0.3 to 2 g/$m^2$.

In the top layer a difference in the capacity of being penetrated and/or solubilized by the aqueous alkaline solution is generated upon image-wise exposure for an alkaline developer according to the invention.

In the present invention the said capacity is increased upon image-wise IR exposure to such degree that the imaged parts will be cleaned out during development without solubilized and/or damaging the non-imaged parts.

The development with the aqueous alkaline solution is preferably done within an interval of 5 to 120 seconds.

Between the top layer and the lithographic base the present invention comprises a first layer soluble in an aqueous developing solution, more preferably an aqueous alkaline developing solution with preferentially a pH between 7.5 and 14. Said layer is preferably contiguous to the top layer but other layers may be present between the top layer and the first layer. The alkali soluble binders used in this layer are preferably hydrophobic binders as used in conventional positive or negative working PS-plates e.g. novolac, polyvinyl phenols, carboxy substituted polymers etc. Typical examples of these polymers are descibed in DE-A- 4 007 428, DE-A- 4 027 301 and DE-A- 4 445 820. The hydrophobic binder used in connection with the present invention is further characterized by insolubility in water and partial solubility/swellability in an alkaline solution and/or partial solubility in water when combined with a cosolvent. Furthermore this aqueous alkali soluble layer is preferably a visible light- and UV-light desensitized layer Said layer is preferably thermally hardenable. This preferably visible light- and UV-desensitized layer does not comprise photosensitive ingredients such as diazo compounds, photoacids, photoinitiators, quinone diazides, sensitizers etc. which absorb in the wavelength range of 250 nm to 650 nm. In this way a daylight stable printing plate may be obtained.

Said first layer preferably also includes a low molecular acid, preferably a carboxylic acid, still more preferably a benzoic acid, most preferably 3,4,5-trimethoxybenzoic acid or a benzophenone.

The ratio between the total amount of low molecular acid or benzophenone and polymer in the first layer preferably ranges from 2:98 to 40:60, more preferably from 5:95 to 20:80. The total amount of said first layer preferably ranges from 0.1 to 10 g/$m^2$, more preferably from 0.3 to 2 g/$m^2$.

In the imaging element according to the present invention, the lithographic base may be an anodized aluminum for all embodiments. A particularly preferred lithographic base is an electrochemically grained and anodized aluminum support. The anodised aluminum support may be treated to improve the hydrophilic properties of its surface. For example, the aluminum support may be silicated by treating its surface with sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulphonic acid, polyvinylbenzenesulphonic acid, sulphuric acid esters of polyvinyl alcohol, and acetals of polyvinyl alcohols formed by reaction with a sulphonated aliphatic aldehyde It is further evident that one or more of these post treatments may be carried out alone or in combination. More detailed descriptions of these treatments are given in GB-A- 1 084 070, DE-A- 4 423 140, DE-A- 4 417 907, EP-A- 659 909, EP-A- 537 633, DE-A- 4 001 466, EP-A- 292 801, EP-A- 291 760 and U.S. Pat. No. 4,458,005.

According to another mode in connection with the present invention, the lithographic base having a hydrophilic surface comprises a flexible support, such as e.g. paper or plastic film, provided with a cross-linked hydrophilic layer for all embodiments. A particularly suitable cross-linked hydrophilic layer may be obtained from a hydrophilic binder cross-linked with a cross-linking agent such as formaldehyde, glyoxal, polyisocyanate or a hydrolyzed tetra-alkylorthosilicate. The latter is particularly preferred.

As hydrophilic binder there may be used hydrophilic (co)polymers such as for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60 percent by weight, preferably 80 percent by weight.

The amount of crosslinking agent, in particular of tetraalkyl orthosilicate, is preferably at least 0.2 parts by weight per part by weight of hydrophilic binder, more preferably between 0.5 and 5 parts by weight, most preferably between 1.0 parts by weight and 3 parts by weight.

A cross-linked hydrophilic layer in a lithographic base used in accordance with the present embodiment preferably also contains substances that increase the mechanical strength and the porosity of the layer. For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica may be added e.g. silica prepared according to Stober as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the cross-linked hydrophilic layer is given a uniform rough texture consisting of microscopic hills and valleys, which serve as storage places for water in background areas.

The thickness of a cross-linked hydrophilic layer in a lithographic base in accordance with this embodiment may vary in the range of 0.2 to 25 $\mu$m and is preferably 1 to 10 $\mu$m.

Particular examples of suitable cross-linked hydrophilic layers for use in accordance with the present invention are disclosed in EP-A- 601 240, GB-P- 1 419 512, FR-P- 2 300 354, U.S. Pat. No. 3,971,660, U.S. Pat. No. 4,284,705 and EP-A- 514 490.

As flexible support of a lithographic base in connection with the present embodiment it is particularly preferred to use a plastic film e.g. substrated polyethylene terephthalate film, cellulose acetate film, polystyrene film, polycarbonate film etc. . . . The plastic film support may be opaque or transparent.

It is particularly preferred to use a polyester film support to which an adhesion improving layer has been provided. Particularly suitable adhesion improving layers for use in accordance with the present invention comprise a hydrophilic binder and colloidal silica as disclosed in EP-A- 619 524, EP-A- 620 502 and EP-A- 619 525. Preferably, the amount of silica in the adhesion improving layer is between 200 mg per $m^2$ and 750 mg per $m^2$. Further, the ratio of silica to hydrophilic binder is preferably more than 1 and the surface area of the colloidal silica is preferably at least 300 $m^2$ per gram, more preferably at least 500 $m^2$ per gram.

According to the second embodiment of this group there is provided a method for making lithographic printing plates including the following steps:

a) preparing a heat mode imaging element having on a lithographic base with a hydrophilic surface a first layer including a polymer, soluble in an aqueous alkaline solution, a compound capable of converting light to heat and a top layer on the same side of the lithographic base as the first layer which top layer is unpenetrable for an alkaline developer;
b) exposing imagewise said heat mode imaging element to actinic light;
c) developing said imagewise exposed heat mode imaging element with said alkaline developer so that the exposed areas of the top layer and the underlying areas of the first layer are dissolved and the unexposed areas of the first layer remain undissolved characterized in that said top layer includes an organic quaternary ammonium salt.

The top layer, in accordance with the present invention comprises an organic quaternary ammonium salt. A mixture of organic quaternary ammonium salts may be used, but it is Preferred to use only one organic quaternary ammonium salt. Said organic quaternary ammonium salt may be a low molecular compound, preferably containing at least a $C_6$ carbon chain, more preferably containing at least a $C_{12}$ carbon groep, still more preferably at least a $C_{12}$ aliphatic group. Most preferable said organic quaternary ammonium salt is a polymer, particularly preferable a poly-p-vinylbenzyltrimethylammonium salt.

The top layer may comprise as binder a water insoluble polymer such as a cellulose ester, a copolymer of vinylidene chloride and acrylonitrile, poly(meth)acrylates, polyvinyl chloride, silicone resins, etc.

The top layer may comprises as a binder resin in accordance with the present invention preferably a water soluble polymer. As water soluble polymer a protein, preferably gelatin may be used. However, also synthetic, semi-synthetic, or natural water soluble polymers may be used. Synthetic polymers are e.g. polyvinyl alcohol, poly-N-vinyl pyrrolidone, polyvinyl imidazole, polyvinyl pyrazole, polyacrylamide, polyacrylic acid, and derivatives thereof, in particular copolymers thereof. Natural substitutes for gelatin are e.g. other proteins such as zein, albumin and casein, cellulose, saccharides, starch, and alginates. In general, the semi-synthetic substitutes for gelatin are modified natural products e.g. gelatin derivatives obtained by conversion of gelatin with alkylating or acylating agents or by grafting of polymerizable monomers on gelatin, and cellulose derivatives such as hydroxyalkyl cellulose, carboxymethyl cellulose, phthaloyl cellulose, and cellulose sulphates.

The total amount of the top layer preferably ranges from 0.1 to 10 $g/m^2$more preferably from 0.3 to 2 $g/m^2$.

In the top layer a difference in the capacity of being penetrated and/or solubilized by the aqueous alkaline solution is generated upon image-wise exposure for an alkaline developer according to the invention. In the present invention the said capacity is increased upon image-wise exposure to actinic light to such degree that the imaged parts will be cleaned out during development without solubilized and/or damaging the non-imaged parts.

The development with the aqueous alkaline solution is preferably done within an interval of 5 to 120 seconds.

The top layer or the layer just underlying said top layer includes a compound capable of converting light to heat. Suitable compounds capable of converting light into heat are preferably infrared absorbing components although the wavelength of absorption is not of particular importance as long as the absorption of the compound used is in the wavelength range of the light source used for image-wise exposure. Particularly useful compounds are for example dyes and in particular infrared dyes, carbon black, metal carbides, borides, nitrides, carbonitrides, bronze-structured oxides and oxides structurally related to the bronze family but lacking the A component e.g. $WO_{2.9}$. It is also possible to use conductive polymer dispersion such as polypyrrole or polyaniline-based conductive polymer dispersions. The lithographic performance and in particular the print endurance obtained depends on the heat-sensitivity of the imaging element. In this respect it has been found that carbon black yields very good and favorable results.

Other favourable dyes are IR-cyanine dyes. A mixture of IR-cyanine dyes may be used, but it is preferred to use only one IR-cyanine dye. Particularly useful IR-cyanine dyes are cyanines dyes with two acid groups, more preferably with two sulphonic groups. Still more preferably are cyanines dyes with two indolenine and two sulphonic acid groups. Most preferably is compound I with the structure as indicated (I)

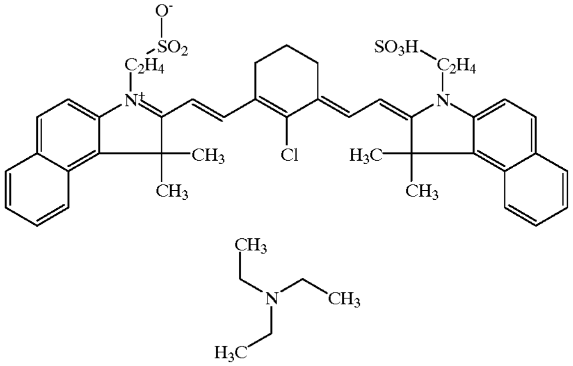

The ratio in weight between the organic quaternary ammonium salt and the compound capable of converting light into heat is preferably between 98:2 to 20:80, more preferably between 95:5 to 50:50.

Between the top layer and the lithographic base the present invention comprises a first layer soluble in an aqueous developing solution, more preferably an aqueous alkaline developing solution with preferentially a pH between 7.5 and 14. Said layer is preferably contiguous to the top layer but other hydrophilic layers may be present between the top layer and the first layer. The alkali soluble binders used in this layer are preferably hydrophobic binders as used in conventional positive or negative working PS-plates e.g. novolac, polyvinyl phenols, carboxy substituted polymers etc. Typical examples of these polymers are descibed in DE-A- 4 007 428, DE-A- 4 027 301 and DE-A- 4 445 820. The hydrophobic binder used in connection with the present invention is further characterized by insolubility in water and partial solubility/swellability in an alkaline solution and/or partial solubility in water when combined with a cosolvent. Furthermore this aqueous alkali soluble layer is preferably a visible light- or UV-light desensitized layer. Still further said layer is preferably thermally hardenable. This preferably visible light- or UV-light desensitized layer does not comprise photosensitive ingredients such as diazo compounds, photoacids, photoinitiators, quinone diazides, desensitizers etc. which absorb in the wavelength range of 250 nm to 650 nm. In this way a daylight stable printing plate may be obtained.

Said first layer preferably also includes a low molecular acid, preferably a carboxylic acid, still more preferably a benzoic acid, most preferably 3,4,5-trimethoxybenzoic acid or a benzophenone.

The weight ratio between the total amount of low molecular acid or benzophenone and polymer in the first layer preferably ranges from 2:98 to 40:60, more preferably from 5:95 to 20:80. The total amount of said first layer preferably ranges from 0.1 to 10 $g/m^2$, more preferably from 0.3 to 2 $g/m^2$.

According to the third embodiment of said group there is provided a method for making lithographic printing plates including the following steps a) preparing a heat mode imaging element having on a lithographic base with a hydrophilic surface a first layer including a polymer, soluble in an acueous alkaline solution and a top layer on the same side of the lithographic base as the first layer which top layer is sensitive to IR-radiation and is unpenetrable for an alkaline developer;

b) exposing imagewise said heat mode imaging element to IR-radiation;

c) developing said imagewise exposed heat mode imaging element with said alkaline developer so that the exposed areas of the top layer and the underlying areas of the first layer are dissolved and the unexposed areas of the first layer remain undissolved characterized in that said top layer includes an IR-dye in an amount between 1 and 100% by weight of the total amount of said IR-sensitive top layer.

The top layer, in accordance with the present invention consists of an IR-dye and preferably of an IR-dye and a binder resin. A mixture of IR-dyes may be used, but it is preferred to use only one IR-dye. Suitable IR-dyes are known since a long time and belong to several different chemical classes, e.g. indoaniline dyes, oxonol dyes, porphine derivatives, anthraquinone dyes, merostyryl dyes, pyrylium compounds and sqarylium derivatives Preferably said IR-dyes, especially for irradiation with a laser source with an emission spectrum of about 1060 nm belongs to the scope of the general formula of the German patent application DE- 4. 31 162. This general formula (I) is represented by:

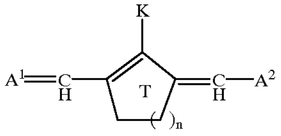

wherein K represents Q together with a counterion An-, or

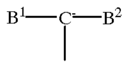

wherein Q represents chlorine, fluorine, bromine, iodine, alkyloxy, aryloxy, dialkylamino, diarylamino, alkylarylamino, nitro, cyano, alkylsulphonyl, arylsulphonyl, heterocyclyl, or a moiety represented by L-S-, wherein L represents alkyl, aryl, heterocyclyl, cyano or substituted carbonyl, thiocarbonyl or iminocarbonyl, An- represents an anion commonly used in the chemistry of cationic dyes, or an equivalent thereof, $B^1$ represents cyano, alkoxycarbonyl, alkyl- or arylcarbonyl, or aminocarbonyl optionally substituted once or twice at the nitrogen atom by alkyl and/or aryl, $B^2$ represents arylsulphonyl, alkylsulphonyl, heteroaryl, or,

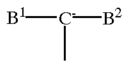

may be represented by

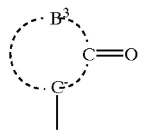

wherein $B^3$ represents the non-metal atoms to complete a carbocyclic or heterocyclic ring, ring T may be substituted by 1 to 3 $C_1$–$C_4$ alkyl groups, n=1 or 2, and $A^1$ and $A^2$ may represent following combinations:

(1) moieties of formulas (IIIa) and (IIIb)

(IIIa)

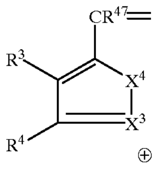

(IIIb)

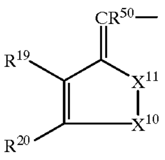

wherein $X^3$, $X^{10}$=O, $X^4$, $X^{11}$=—$CR^{38}$=—$CR^{39}$, $R^{38}$ and $R^{39}$ each independently represent hydrogen, alkyl, aryl or together the necessary non-metal atoms to complete a cycloaliphatic, aromatic or heterocyclic 5- or 7-membered ring, or independently from each other, the necessary non-metal atoms to complete a cycloaliphatic, aromatic or heterocyclic 5- or 7-membered ring, and $R^3$, $R^4$, $R^{19}$ and $R^{20}$ each independently represent hydrogen, $C_1$–$C_8$ alkyl, aryl, halogen, cyano, alkoxycarbonyl, optionally substituted aminocarbonyl, amino, monoalkylamino, dialkylamino, hydroxy, alkoxy, aryloxy, alkylthio, arylthio, acyloxy, acylamino, arylamino, alkylcarbonyl, arylcarbonyl, or the necessary non-metal atoms to complete a cycloaliphatic, aromatic or heterocyclic 5- or 7-membered ring, $R^{47}$ and $R^{50}$ each independently represent hydrogen, alkyl, aryl, cyano, alkoxycyano or the non-metal atoms to form a saturated or unsaturated 5- to 7-membered ring, in the first case between $R^{47}$ and resp. $X^4$ and $R^3$, in the second case between $R^{50}$ and resp. $X^{11}$ and $R^{19}$.

(2) moieties of the same formulas (IIIa) and (IIIb)

wherein $X^3$, $X^{10}$=$R^{44}$N, $X^4$, $X^{11}$=—$CR^{38}$=—$CR^{39}$, and wherein $R^3$ and $R^4$, respectively $R^{38}$ and $R^{39}$ together represent the atoms to complete an optionally substituted aromatic ring, and wherein $R^{44}$ represents optionally substituted alkyl or aryl, or the necessary atoms to complete a 5- or 7-membered ring, (3) moieties of the formulas (IVa) and (IVb):

(IVa)

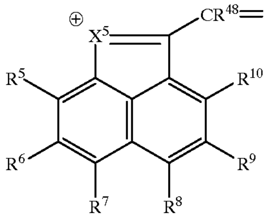

(IVb)

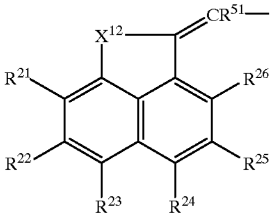

wherein $X^5$ and $X^{12}$ each independently represent O, S, Se, Te or $R^{44}$N, $R^5$ to $R^{10}$ and $R^{21}$ to $R^{26}$ each independently represent one of the meanings given above for $R^3$, and $R^{48}$ and R51 each independently represent hydrogen, alkyl, aryl or alkoxycarbonyl, with the exception for those compounds in which together $X^5$, $X^{12}$=$R^{44}$N and Q=halogen, (4) moieties of formulas (VIIa) and (VIIb)

(VIIa)

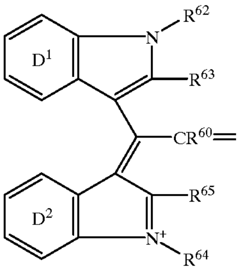

(VIIb)

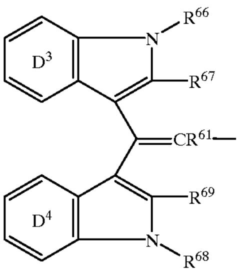

wherein $R^{60}$ and $R^{61}$ each independently represent hydrogen, alkyl, aryl, cyano, alkoxycarbonyl, halogen, $R^{62}$ $R^{64}$ $R^{66}$, $R^{68}$ each independently represent alkyl or aryl, $R^{63}$, $R^{65}$, $R^6$ $R^{67}$, $R^{69}$ each independently represent hydrogen, alkyl or aryl, and wherein the rings $D^1$ to $D^4$ each independently may be substituted once or frequently by hydrogen, chlorine, bromine, alkyl, or alkoxy.

Most preferred subclasses of this general formula (I) are the following:

compounds according to formula (XXI):

(XXI)

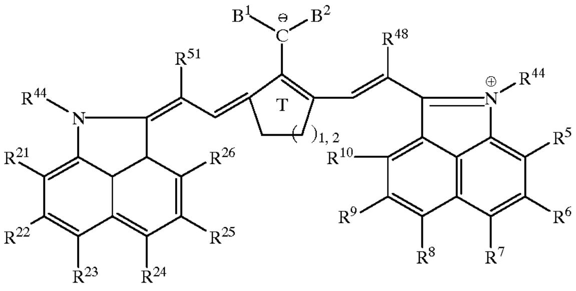

compounds according to formula (XXIII):

(XXIII)

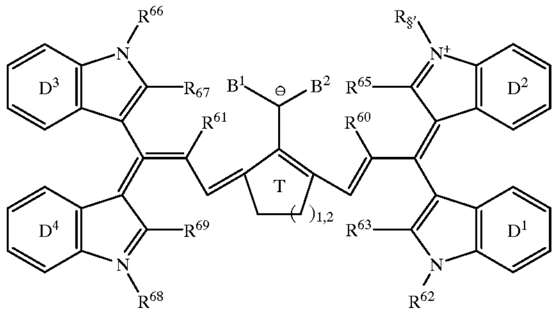

compounds according to formula (XXV):

(XXV)

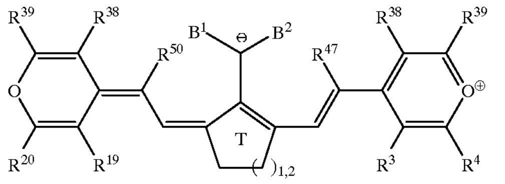

compounds according to formula (XXVII)

(XXVII)

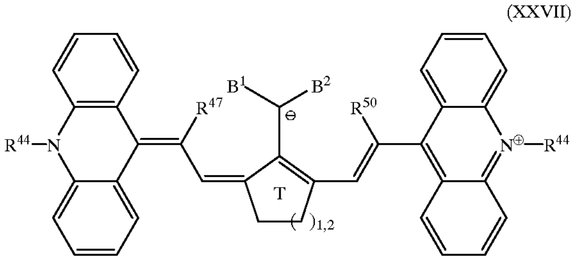

compounds according to formula (XXIX):

(XXIX)

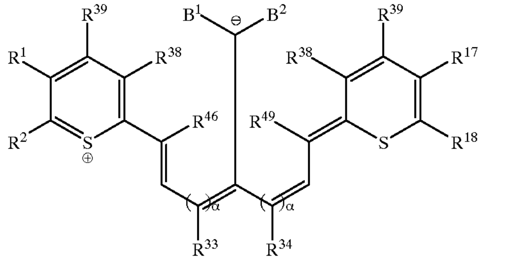

In the formulas of these subclasses R1, R2, R17 and R18 have the same meaning as R3, and B1, B2, the other R symbols, T, and the D symbols are defined as hereinbefore, and α is 0 or 1.

Other preferred IR-dyes, especially for irradiation with a laser source with an emission spectrum of about 830 nm belong to the scope of the following general formulas.

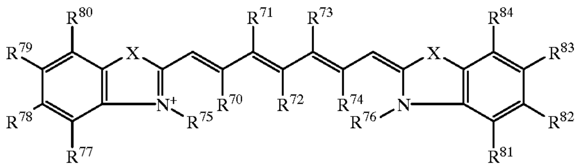

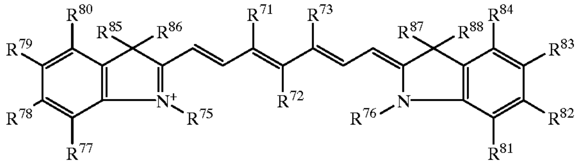

wherein X, $X^1$ each independently represents O, S $R^{70}$–$R^{74}$ each independently may represent hydrogen, alkyl or aryl;

$R^{70}$ together with $R^{72}$, $R^{72}$ together with $R^{74}$, $R^{71}$ together with $R^{73}$, $R^{70}$ together with $R^{72}$ and $R^{74}$ may form a carbocyclic ring.

$R^{72}$ may also represents halogen, $NR^{88}R^{89}$ ($R^{88}$,$R^{89}$ each independently represents alkyl, aryl, or may form a (hetero)cyclic ring), PR88$R^{89}$, ester-COO$R^{92}$ ($R^{92}$ represents alkyl, or aryl), barbituric acid group (with optionally substituted N-atoms).

$R^{71}$ or $R^{73}$ may represents: —OCO$R^{93}$; $R^{93}$ represents alkyl, or aryl.

$R^{77}$ together with $R^{78}$, $R^{78}$ together with $R^{79}$, $R^{79}$ together with $R^{80}$, $R^{81}$ together with $R^{82}$, $R^{82}$ together with $R^{83}$, $R^{83}$ together with $R^{84}$ may form an annulated benzoring optionally substituted with a carbocyclic acid, ester or sulphogroup.

$R^{78}$, $R^{79}$, $R^{82}$, $R^{83}$ each independently may represent hydrogen, alkyl, aryl, halogen, ester, carbocyclic acid, amide, amine, nitrile, alkoxy, aryloxy, or sulpho group.

$R^{85}$, $R^{86}$, $R^{87}$, $R^{88}$ each independently may represent an alkylgroup, $R^{85}$ together with $R^{86}$, $R^{87}$ together with $R^{88}$ may form a cyclic (spiro)ring.

$R^{75}$, R76 each independently represents an alkyl, aryl group; $C_nH_{2n}SO_3M$ (n represents an integer from 2 to 4 and M H or positively charged counterion); $—C_nH_{2n}COOM$ (n represents an integer from 1 to 5 and M H or positively charged counterion); $—C_nH_{2n}COOR^{94}$ (n represents an integer from 1 to 5 and R94 alkyl, or aryl group);

L1-$CONHSO_2R^{95}$ (L1 represents $—C_nH_{2n}—$ with n an integer from 1 to 4 and $R^{95}$ alkyl or aryl).

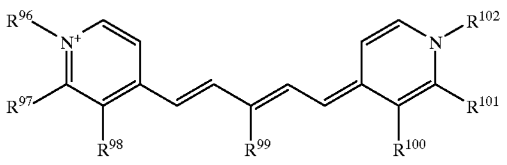

$R^{96}$, $R^{102}$ represents alkyl, or aryl group; $—C_nH_{2n}SO_3M$ (n represents an integer from 2 to 4 and M H or positively charged counterion); $—C_nH_{2n}COOM$ (n represents an integer from 1 to 5 and M H or positively charged counterion); $—C_nH_{2n}COOR^{103}$ (n represents an integer from 1 to 5 and $R^{103}$ alkyl, or aryl group); —L1—$CONHSO_2R^{104}$ (L1 represents $—C_nH_{2n}—$ with n an integer from 1 to 4 and $R^{104}$ alkyl or aryl). $R^{97}$, $R^{98}$ $R^{100}$, $R^{101}$ may each independently represent: hydrogen, alkyl, aryl; $R^{97}$ together with $R^{98}$, $R^{100}$ together with $R^{101}$ may form an annulated benzoring.

$R^{98}$ may represent : hydrogen, alkyl, aryl, halogen, ester, or —SO2$R^{105}$ ($R^{105}$ represents an alkyl or aryl).

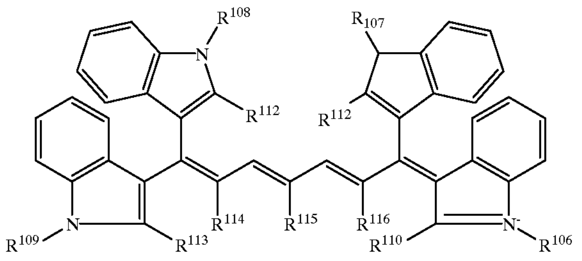

$R^{106}$, $R^{107}$, $R^{108}$, $R^{109}$ each independently may represent alkyl, aryl group; $—C_nH_{2n}SO_3M$ represents an integer from 2 to 4 and M H or positively charged counterion); $—C_nH_{2n}COOM$ (n represents an integer from 1 to 5 and M H or positively charged counterion); $—C_nH_{2n}COOR^{117}$ (n represents an integer from 1 to 5 and $R^{117}$ alkyl, or aryl group); —L1—$CONHSO_2R^{118}$ (L1 represents $—C_nH_{2n}—$ with n an integer from 1 to 4 and $R^{118}$ alkyl or aryl).

$R^{110}$, $R^{111}$, $R^{112}$, $R^{113}$ each independently represents: hydrogen, alkyl, or aryl group.

$R^{114}$, $R^{115}$, $R^{116}$ each indepentdently may represent: hydrogen, alkyl, or aryl group; $R^{115}$ represents halogen, ester, or —SO2$R^{119}$ ($R^{119}$ represents alkyl, or aryl).

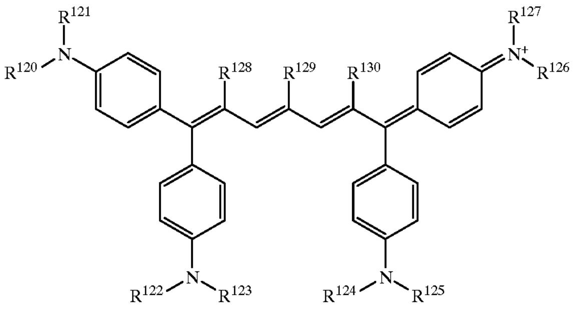

$R^{120}$, $R^{121}$, $R^{122}$, $R^{123}$ $R^{124}$, $R^{125}$, $R^{126}$, $R^{127}$: each independently may represent alkyl, aryl group; $—C_nH_{2n}SO_3M$ (n represents an integer from 2 to 4 and M H or positively charged counterion); $—C_nH_{2n}COOM$ (n represents an integer from 1 to 5 and M H or positively charged counterion); $—C_nH_{2n}COOR^{131}$ (n represents an integer from 1 to 5 and $R^{131}$ alkyl, or aryl group); —L1—$CONHSO_2R^{132}$ (L1 represents $—C_nH_{2n}—$ with n an integer from 1 to 4 and $R^{132}$ alkyl or aryl). $R^{120}$ together with $R^{121}$, $R^{122}$ together with $R^{123}$, $R^{124}$ together with $R^{125}$, $R^{126}$ together with $R^{127}$ may form a cyclic ring.

$R^{128}$, $R^{129}$, $R^{130}$: each independently may represents hydrogen, alkyl, or aryl group; $R^{129}$ may represent halogen, ester, or —SO2$R^{133}$ ($R^{133}$ represents alkyl, or aryl).

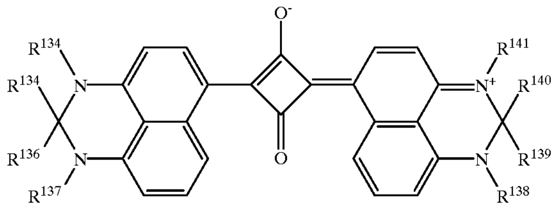

$R^{134}$, $R^{137}$, $R^{138}$, $R^{141}$ each independently may represent: hydrogen, alkyl, or aryl $R^{134}$ together with $R^{135}$, $R^{141}$ together with $R^{140}$ may form a carbocyclic ring.

$R^{135}$ together with $R^{136}$, $R^{139}$ together with $R^{140}$ may form a carbocyclic ring.

$R^{135}$, $R^{136}$, $R^{139}$, $R^{140}$ each independently may represent: hydrogen, alkyl, aryl group; $—C_nH_{2n}SO_3M$ (n represents an integer from 2 to 4 and M H or positively charged counterion); $—C_nH_{2n}COOM$ (n represents an integer from 1 to 5 and M H or positively charged counterion);

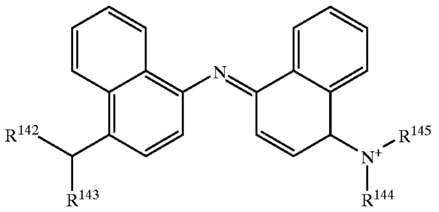

$R^{142}$, $R^{143}$, $R^{144}$, $R^{145}$ each independently represents alkyl, aryl group; $—C_nH_{2n}SO_3M$ represents an integer from 2 to 4 and M H or positively charged counterion); $—C_nH_{2n}COOM$ (n represents an integer from 1 to 5 and M H or positively charged counterion); $—C_nH_{2n}COOR^{146}$ (n represents an integer from 1 to 5 and $R^{146}$ alkyl, or aryl group); $—L1—CONHSO_2R^{147}$ (L1 represents $—C_nH_{2n}—$ with n an integer from 1 to 4 and $R^{147}$ alkyl or aryl).

R142 together with R143, R144 together with R145 may form a cyclic ring.

The charge of the dyes may be compensated by any (intermolecular or intramolecular) counterion.

As a binder resin in the top layer gelatin, cellulose, cellulose esters e.g. cellulose acetate, polyvinyl alcohol, polyvinyl pyrrolidone, a copolymer of vinylidene chloride and acrylonitrile, poly(meth)acrylates, polyvinyl chloride, nitrocellulose, silicone resins etc. may be used. Preferred as binder resin are hydrophobic binder resins, more preferably phenolic resins e.g. novolacs and vinyl phenols.

The IR-dyes are present preferably in an amount between 10 and 80 parts by weight of the total amount of said IR-sensitive top layer.

The total amount of the top layer preferably ranges from 0.1 to 10 g/m2 more preferably from 0.3 to 2 g/m2.

In the top layer a difference in the capacity of being penetrated and/or solubilized by the aqueous alkaline solution is generated upon image-wise exposure according to the invention.

In the present invention the said capacity is increased upon image-wise IR exposure to such degree that the imaged parts of the top layer and the underlying areas of the first layer will be cleaned out during development without solubilizing and/or damaging the non-imaged parts.

The development with the aqueous alkaline solution is preferably done within an interval of 5 to 120 seconds.

Between the top layer and the lithographic base the present invention comprises a first layer soluble in an aqueous developing solution, more preferably an aqueous alkaline developing solution with a pH between 7.5 and 14. Said layer is preferably contiguous to the top layer. The alkali soluble polymers used in this layer are preferably hydrophobic and ink accepting polymers as used in conventional positive or negative working PS-plates e.g. novolac, polyvinyl phenols, carboxy substituted polymers etc. Typical examples of these polymers are descibed in DE-A- 4 007 428, DE-A- 4 027 301 and DE-A- 4 445 820. The hydrophobic polymer used in connection with the present invention is further characterised by insolubility in water and at least partial solubility/swellability in an alkaline solution and/or at least partial solubility in water when combined with a cosolvent. Furthermore this aqueous alkali soluble layer is preferably a visible light- and UV-light desensitized layer. Said layer is preferably thermally hardenable. This preferably visible light- and UV-light desensitized layer does not comprise photosensitive ingredients such as diazo compounds, photoacids, photoinitiators, quinone diazides, sensitisers etc. which absorb in the wavelength range of 250nm to 650nm. In this way a daylight stable printing plate may be obtained.

Said first layer preferably also includes a low molecular acid, preferably a carboxylic acid, still more preferably a benzoic acid, most preferably 3,4,5-trimethoxybenzoic acid or a benzophenone.

The ratio between the total amount of low molecular acid or benzophenone and polymer in the first layer preferably ranges from 2:98 to 40:60, more preferably from 5:95 to 20:80. The total amount of said first layer preferably ranges from 0.1 to 10 g/m2, more preferably from 0.3 to 2 g/m2.

According to the fourth embodiment of this group there is provided a method for making lithographic printing plates including the following steps:

a) preparing a heat mode imaging element comprising on a lithographic base having a hydrophilic surface a layer comprising a polymer, soluble in an aqueous alkaline solution and a top layer that is sensitive to IR-radiation;
b) exposing imagewise said heat mode imaging element to actinic light;
c) developing said imagewise exposed heat mode imaging element with said aqueous alkaline solution so that the exposed areas of the top layer and the underlying areas of the first layer are dissolved and the unexposed areas of the first layer remain undissolved. characterized in that said top layer upon exposure to IR-radiation has an increased capacity for being penetrated and/or solubilized by an aqueous alkaline solution.

The top layer, in accordance with the present invention comprises an IR-absorbing compound and a binder resin. Particularly useful IR-absorbing compounds are for example infrared dyes, metal carbides, borides, nitrides, carbonitrides, bronze-structured oxides and oxides structurally related to the bronze family but lacking the A component e.g. WO2.9. Preferably carbon black is used as the IR-absorbing compound. As a binder resin gelatin, cellulose, cellulose esters e.g. cellulose acetate, polyvinyl alcohol, polyvinyl pyrrolidone, a copolymer of vinylidene chloride and acrylonitrile, poly(meth)acrylates, polyvinyl chloride, silicone resins etc. may be used. Preferred as binder resin is nitrocellulose.

In the top layer a difference in the capacity of being penetrated and/or solubilized by the aqueous alkaline solution is generated upon image-wise exposure. A difference in the capacity of the top layer to be penetrated and/or solubilized by a developing solution may be obtained by a thermally induced physical or chemical transformation. Examples of thermally induced physical transformations which generate a difference in said capacity are: the above cited embodiments which creates an increase in the capacity of being penetrated and/or solubilized in the exposed areas and laser induced removal of material which creates an increase in the capacity in the exposed areas of the layer for penetration and/or solubilization by the developing solution. Examples of thermally induced chemical transformations which generate a difference in the capacity of the layer for penetration and/or solubilization by a developer are: laser induced change in polarity which increases the said capacity in the exposed areas. The change in said capacity created upon laser exposure, should be high enough to allow a complete clean-out without damaging and/or solubilized the resulting image upon development with an aqueous alkaline solution.

In the case that the said capacity is increased upon image-wise laser exposure, the imaged parts will be cleaned out during development without solubilizing and/or damaging the non-imaged parts.

The development with the aqueous alkaline solution is preferably done within an interval of 5 to 120 seconds.

Between the top layer and the lithographic base the present invention comprises a layer soluble in an aqueous developing solution more preferably an aqueous alkaline developing solution with preferentially a pH between 7.5 and 14. The alkali soluble binders used in this layer are preferably hydrophobic binders as used in conventional positive or negative working PS-plates e.g. novolac, polyvinyl phenols, carboxy substituted polymers etc. Typical examples of these polymers are descibed in DE-A-4007428, DE-A-4027301 and DE-A-4445820. The hydrophobic binder used in connection with the present invention is further characterized by insolubility in water and partial solubility/swellability in an alkaline solution and/or partial solubility in water when combined with a cosolvent. Furthermore this aqueous alkali soluble layer is preferably a visible light- and UV-desensitised layer that is thermally hardenable and ink-accepting. This visible light- and UV-desensitized layer does not comprise photosensitive ingredients such as diazo compounds, photoacids, photoinitiators, quinone diazides, sensitizers etc. which absorb in the wavelength range of 250 nm to 650 nm. In this way a daylight stable printing plate may be obtained. Furthermore the IR-radiation sensitive top layer may be partially solubilized in the aqueous alkali soluble layer upon exposure.

Said first layer preferably also includes a lo.; molecular acid, preferably a carboxylic acid, still more preferably a benzoic acid, most preferably 3,4,5-trimethoxybenzoic acid or a benzophenone.

The ratio between the total amount of low molecular acid or benzophenone and polymer in the first layer preferably ranges from 2:98 to 40:60, more preferably from 5:95 to 20:80. The total amount of said first layer preferably ranges from 0.1 to 10 g/m2, more preferably from 0.3 to 2 g/m2.

In a second group of embodiments the first layer and the second layer are the same.

In a first embodiment of the second group there is provided a method for making lithographic printing plates including the following steps a) preparing a heat mode imaging element consisting of a lithographic base with a hydrophilic surface and a top layer which top layer is sensitive to IR-radiation, comprises a polymer, soluble in an aqueous alkaline solution and is unpenetrable for an alkaline developer;
b) exposing imagewise said heat mode imaging element to IR-radiation;
c) developing said imagewise exposed heat mode imaging element with said alkaline developer so that the exposed areas of the top layer are dissolved and the unexposed areas of the top layer remain undissolved characterized in that said top layer includes an IR-dye.

The IR-sensitive layer, in accordance with the present invention comprises an IR-dye and a polymer, soluble in an aqueous alkaline solution. A mixture of IR-dyes may be used, but it is preferred to use only one IR-dye. Suitable IR-dyes are those mentioned above in the third embodiment of the first group. The IR-dyes are present preferably in an amount between 1 and 60 parts, more preferably between 3 and 50 parts by weight of the total amount of said IR-sensitive top layer.

The alkali soluble polymers used in this layer are preferably hydrophobic and ink accepting polymers as used in conventional positive or negative working PS-plates e.g. carboxy substituted polymers etc. More preferably is a phenolic resin such as polyvinylfenol or a novolac polymer. Most preferred is a novolac polymer. Typical examples of these polymers are descibed in DE-A- 4 007 428, DE-A- 4 027 301 and DE-A- 4 445 820. The hydrophobic polymer used in connection with the present invention is further characterized by insolubility in water and at least partial solubility/swellability in an alkaline solution and/or at least partial solubility in water when combined with a cosolvent.

Furthermore this IR-sensitive layer is preferably a visible light- and UV-light desensitized layer. Still further said layer is preferably thermally hardenable. This preferably visible light- and UV-light desensitized layer does not comprise photosensitive ingredients such as diazo compounds, photoacids, photoinitiators, quinone diazides, sensitisers etc. which absorb in the wavelength range of 250 nm to 650 nm. In this way a daylight stable printing plate may be obtained.

Said IR-sensitive layer preferably also includes a low molecular acid, more preferably a carboxylic acid, still more preferably a benzoic acid, most preferably 3,4,5-trimethoxybenzoic acid or a benzofenone, more preferably trihydroxybenzofenone.

The ratio between the total amount of low molecular acid or benzofenone and polymer in the IR-sensitive layer preferably ranges from 2:98 to 40:60, more preferably from 5:95 to 30:70. The total amount of said IR-sensitive layer preferably ranges from 0.1 to 10 g/$m^2$, more preferably from 0.3 to 2 g/$m^2$.

In the IR-sensitive layer a difference in the capacity of being penetrated and/or solubilized by the alkaline developer is generated upon image-wise exposure for an alkaline developer according to the invention.

According to the second embodiment of this group there is provided a method for making lithographic printing plates including the following steps a) preparing a heat mode imaging element consisting of a lithographic base with a hydrophilic surface and a top layer which top layer is sensitive to IR-radiation, comprises a polymer, soluble in an aqueous alkaline solution and is unpenetrable for an alkaline developer;
b) exposing imagewise said heat mode imaging element to IR-radiation;
c) developing said imagewise exposed heat mode imaging element with said alkaline developer so that the exposed areas of the top layer are dissolved and the unexposed areas of the top layer remain undissolved characterized in that said top layer includes an IR-absorbing pigment.

The IR-sensitive layer, in accordance with the present invention comprises an IR-absorbing pigment and a polymer, soluble in an aqueous alkaline solution. A mixture of IR-absorbing pigments may be used, but it is preferred to use only one IR-absorbing pigment. Particularly useful IR-absorbing pigments are carbon black, metal carbides, borides, nitrides, carbonitrides, bronze-structured oxides and oxides structurally related to the bronze family but lacking the A component e.g. WO2.9. It is also possible to use conductive polymer dispersion such as polypyrrole or polyaniline-based onductive polymer dispersions. The lithographic performance and in particular the print endurance obtained depends on the heat-sensitivity of the imaging element. In this respect it has been found that carbon black yields very good and favorable results.

The IR-absorbing pigments are present preferably in an amount between 1 and 60 parts, more preferably between 3 and 50 parts by weight of the total amount of said IR-sensitive top layer.

The alkali soluble polymers used in this layer are preferably hydrophobic and ink accepting polymers as used in conventional positive or negative working PS-plates e.g. carboxy substituted polymers etc. More preferably is a phenolic resin such as polyvinylfenol or a novolac polymer. Most preferred is a novolac polymer. Typical examples of these polymers are descibed in DE-A- 4 007 428, DE-A- 4 027 301 and DE-A- 4 445 820. The hydrophobic polymer used in connection with the present invention is further characterized by insolubility in water and at least partial solubility/swellability in an alkaline solution and/or at least partial solubility in water when combined with a cosolvent.

Furthermore this IR-sensitive layer is preferably a visible light- and UV-light desensitized layer. Still further said layer is preferably thermally hardenable. This preferably visible light- and UV-light desensitized layer does not comprise photosensitive ingredients such as diazo compounds, photoacids, photoinitiators, quinone diazides, sensitisers etc. which absorb in the wavelength range of 250 nm to 650 nm. In this way a daylight stable printing plate may be obtained.

Said IR-sensitive layer preferably also includes a low molecular acid, more preferably a carboxylic acid, still more preferably a benzoic acid, most preferably 3,4,5-trimethoxybenzoic acid or a benzofenone, more preferably trihydroxybenzofenone.

The ratio between the total amount of low molecular acid or benzofenone and polymer in the IR-sensitive layer preferably ranges from 2:98 to 40:60, more preferably from 5:95 to 30:70. The total amount of said IR-sensitive layer preferably ranges from 0.05 to 10 g/m$^2$, more preferably from 0.1 to 2 g/m$^2$.

Image-wise exposure in connection with the present invention is an image-wise scanning exposure involving the use of a laser that operates in the infrared or near-infrared, i.e. wavelength range of 700–1500 nm. Most preferred are laser diodes emitting in the near-infrared. Exposure of the imaging element may be performed with lasers with a short as well as with lasers with a long pixel dwell time. Preferred are lasers with a pixel dwell time between 0.005 $\mu$s and 20 $\mu$s.

After the image-wise exposure the heat mode imaging element is developed by rinsing it with an alkaline developer. The alkaline developer used in the present invention have a pH of at least 12 and a surface tension of at least 30 mN/m, more preferably of at least 35 mN/m. Thus the imaged parts of the top layer that were rendered more penetrable for the aqueous alkaline solution upon exposure and the corresponding parts of the underlying layer, if there is any, are cleaned-out whereby a positive working printing plate is obtained.

Preferably the development of the image-wise exposed imaging element is carried out between 15 and 45° C., more preferably between 22 and 35° C.

In the present invention, the composition of the developer used is very important.

Preferably the developers and replenishers for developer used in the invention are preferably aqueous solutions mainly composed of alkali metal silicates and alkali metal hydroxides represented by MOH or their oxyde, represented by $M_2O$; more preferably, wherein said developer comprises $SiO_2$ and $M_2O$ in a molar ratio of 0.5 to 1.5 and a concentration of $SiO_2$ of 0.5 to 5% by weight. As such alkali metal silicates, preferably used are, for instance, sodium silicate, potassium silicate, lithium silicate and sodium metasilicate. On the other hand, as such alkali metal hydroxides, preferred are sodium hydroxide, potassium hydroxide and lithium hydroxide.

The developers used in the invention may simultaneously contain other alkaline agents. Examples of such other alkaline agents include such inorganic alkaline agents as ammonium hydroxide, sodium tertiary phosphate, sodium secondary phosphate, potassium tertiary phosphate, potassium secondary phosphate, ammonium tertiary phosphate, ammonium secondary phosphate, sodium bicarbonate, sodium carbonate, potassium carbonate and ammonium carbonate; and such organic alkaline agents as mono-, di- or triethanolamine, mono-, di- or trimethylamine, mono-, di- or triethylamine, mono- or di-isopropylamine, n-butylamine, mono-, di- or triisopropanolamine, ethyleneimine, ethylenediimine and tetramethylammonium hydroxide.

In the preferred developer, particularly important is the molar ratio in the developer of $[SiO_2]/[M_2O]$, which is generally 0.5 to 1.5, preferably 0.7 to 1.3. This is because if the molar ratio is less than 0.5, great scattering of activity is observed, while if it exceeds 1.5, it becomes difficult to perform rapid development and the dissolving out or removal of the light-sensitive layer on image areas is liable to be incomplete. In addition, the concentration of $SiO_2$ in the developer and replenisher preferably ranges from 1 to 6% by weight. Such limitation of the concentration of $SiO_2$ makes it possible to stably provide lithographic printing plates having good finishing qualities even when a large amount of plates according to the invention are processed for a long time period.

In a particular preferred embodiment, an aqueous solution of an alkali metal silicate having a molar ratio $[SiO_2]/[M_2O]$, which ranges from 1.0 to 1.5 and a concentration of $SiO_2$ of 1 to 6% by weight is used as a developer. In such case, it is a matter of course that a replenisher having alkali strength equal to or more than that of the developer is employed. In order to decrease the amount of the replenisher to be supplied, it is advantageous that a molar ratio, $[SiO_2]/[M_2O]$, of the replenisher is equal to or smaller than that of the developer, or that a concentration of $SiO_2$ is high if the molar ratio of the developer is equal to that of the replenisher.

In the developers and the replenishers used in the invention, it is possible to simultaneously use organic solvents having solubility in water at 20° C. of not more than 10% by weight according to need. Examples of such organic solvents are such carboxilic acid esters as ethyl acetate, propyl acetate, butyl acetate, amyl acetate, benzyl acetate, ethylene glycol monobutyl acetate, butyl lactate and butyl levulinate; such ketones as ethyl butyl ketone, methyl isobutyl ketone and cyclohexanone; such alcohols as ethylene glycol monobutyl ether, ethylene glycol benzyl ether, ethylene glycol monophenyl ether, benzyl alcohol, methylphenylcarbinol, n-amyl alcohol and methylamyl alcohol; such alkyl-substituted aromatic hydrocarbons as xylene; and such halogenated hydrocarbons as methylene dichloride and monochlorobenzene. These organic solvents may be used alone or in combination. Particularly preferred is benzyl alcohol in the invention. These organic solvents are added to the developer or replenisher therefor generally in an amount of not more than 5% by weight and preferably not more than 4% by weight.

In order to enhance developing stability of the developers and replenishers used in the invention, the following compounds may simultaneously be used.

Examples of such compounds are neutral salts such as NaCl, KCl and KBr as disclosed in JN-A- 58- 75 152; chelating agents such as EDTA and NTA as disclosed in JN-A- 58- 190 952 (U.S-A- 4 469 776), complexes such as [Co(NH3)6]C13 as disclosed in JN-A- 59- 121 336 (U.S. Pat. No. 4,606,995); ionizable compounds of elements of the group IIa, IIIa or IIIb of the Periodic Table such as those disclosed in JN-A- 55- 25 100; tetramethyldecyne diol as disclosed in U.S. Pat. No. 4,374,920; cationic polymers such as methyl chloride quaternary products of p-dimethylaminomethyl polystyrene as disclosed in JN-A-55- 95 946; amphoteric polyelectrolytes such as copolymer of vinylbenzyl trimethylammonium chloride and sodium acrylate as disclosed in JN-A- 56- 142 528; reducing inorganic salts such as sodium sulfite as disclosed in JN-A- 57-192 952 (U.S. Pat. No. 4,467,027) and alkaline-soluble mercapto compounds or thioether compounds such as thiosalicylic acid, cysteine and thioglycolic acid; inorganic lithium compounds such as lithium chloride as disclosed in JN-A- 58- 59 444; organic lithium compounds such as lithium benzoate as disclosed in JN-A- 50 34 442; organoboron compounds as disclosed in JN-A- 59- 84 241 (U.S. Pat. No. 4,500,625); quaternary ammonium salts such as tetraalkylammonium oxides as disclosed in EP-A- 101 010; and bactericides such as sodium dehydroacetate as disclosed in JN-A- 63- 226 657.

In the method for development processing of the present invention, any known means of supplementing a replenisher for developer may be employed. Examples of such methods preferably used are a method for intermittently or continuously supplementing a replenisher as a function of the amount of PS plates processed and time as disclosed in JN-A- 55- 115 039 and GB-A- 2 046 931, a method comprising disposing a sensor for detecting the degree of light-sensitive layer dissolved out in the middle portion of a developing zone and supplementing the replenisher in proportion to the detected degree of the light-sensitive layer dissolved out as disclosed in JN-A- 58- 95 349 (U.S. Pat. No. 4,537,496); a method comprising determining the impedance value of a developer and processing the detected impedance value by a computer to perform supplementation of a replenisher as disclosed in GB-A- 2 208 249.

The printing plates of the present invention may also be used in the printing process as seamless sleeve printing plates. In this option the printing plate is soldered in a cylindrical form by means of a laser. This cylindrical printing plate which has as diameter the diameter of the print cylinder is slided on the print cylinder instead of applying in a classical way a classically formed printing plate. More details on sleeves are given in "Grafisch Nieuws" ed. Keesing, 15, 1995, page 4 to 6.

After the development of an image-wise exposed imaging element with an alkaline developer and drying,the plate is preferably rinsed with water. The plate is then dried and preferably gummed. The obtained plate may then be used as a printing plate as such. However, to improve durability it is still possible to bake said plate at a temperature between 200° C. and 300° C. for a period of 30 seconds to 5 minutes. Also the imaging element may be subjected to an overall post-exposure to UV-radiation to harden the image in order to increase the run lenght of the printing plate.

The following examples illustrate the present invention without limiting it thereto. All parts and percentages are by weight unless otherwise specified.

EXAMPLES

Example 1

Preparation of the Lithographic Base

A 0.30 mm thick aluminum foil was degreased by immersing the foil in an aqueous solution containing 5 g/l of sodium hydroxide at 50° C. and rinsed with demineralized water. The foil was then electrochemically grained using an alternating current in an aqueous solution containing 4 g/l of hydrochloric acid, 4 g/l of hydroboric acid and 5 g/l of aluminum ions at a temperature of 35° C. and a current density of 1200 $A/m^2$ to form a surface topography with an average center-line roughness Ra of 0.5 mm.

After rinsing with demineralized water the aluminum foil was then etched with an aqueous solution containing 300 g/l of sulfuric acid at 60° C. for 180 seconds and rinsed with demineralized water at 25° C. for 30 seconds.

The foil was subsequently subjected to anodic oxidation in an aqueous solution containing 200 g/l of sulfuric acid at a temperature of 45° C., a voltage of about 10 V and a current density of 150 $A/m^2$ for about 300 seconds to form an anodic oxidation film of 3.00 $g/m^2$ of $Al_2O_3$ then washed with demineralized water, posttreated with a solution containing polyvinylphosphonic acid and subsequently with a solution containing aluminum trichloride, rinsed with demineralized water at 20° C. during 120 seconds and dried.

Preparation of the Heat-mode Imaging Element 1 and 2.

The IR-sensitive layer was coated onto the above described lithographic base from a 4.9% wt solution in ethyl-/buthylacetate 60/40 with a wet thickness of 25 μm. The resulting IR-sensitive layer contained 22.3% of carbon black (Special Schwarz 250), 8.3% of 3,4,5-trimethoxybenzoic acid, 61.1% of Alnovol PN 452, 0.5% Solsperse 5000, 2.2% Solsperse 28000 and 2.2% Nitrocellulose E950. The coating was then dried at 110° C.

Exposing the Heat-mode Imaging Element

This material was imaged with a GERBER C42T TM internal drum platesetter at 12,000 rpm (367 m/s, pixel dwell time 0.032 μs) and 2540 dpi. The power level of the laser in the image plane was 4.8 W.

Developing and Printing the Imagewise Exposed Element

After identical exposure of two identical prepared imaging elements, these two elements were developed in an aqueous alkaline developing solution as described in tabel 1. These developing was carried out in a Technigraph NPX-32 processor filled with the in tabel 1 described developing solution in the developer section, and with water in the rinsing section and Ozasol RC795 gum in the gumming section.

The diptime in the developing solution was 44 seconds and the developing temperature was 26° C.

Table 1

| Element | 1 | 2 |
|---|---|---|
| Alkaline developer | 1 | 2 |
| pH | 13.2 | 13.2 |
| Surface tension | 63 mN/m | 28 mN/m |
| Dmax | 0.74 | 0.30 |
| Dmin | 0.00 | 0.00 |
| Dot rendering (200 lpi) | 3–99 | 6–98 |
| Dot rendering 40% | 40 | 33 |
| Dot rendering 50% | 50 | 40 |
| Dot rendering 70% | 72 | 65 |

Alkaline developer 1 comprises sodium silicate (0.3 mole/l) in water and the pH is obtained by adding sodium hydroxide. Alkaline developer 2 is identical with alkaline developer 1 except that the surface tension was obtained by adding octylsulphate.

During processing the IR-exposed areas are dissolving very rapidly, resulting in a positive working plate. The results on plate with respect to image quality are presented in Table 1.

The plates were both printed on a Heidelberg GTO46 printing machine with a conventional ink (A B Dick 1020) and fountain solution (Rotamatic), resulting in prints without any scumming in IR-exposed areas.

However the element 1 (developed in aqueous alkaline solution with high surface tension) renders the 3% dot on plate while element 2 is unable to render even 5% dot.

At the same time in element 2 a clear dot attack was detected over the full range of the screenscale (e.g. 50% dot is rendered only 40%), while this dot attack is not observed with element 1.

On printing the element 2 almost no image was left on print, because the image attack during development results in very low mechanical resistance.

Example 2

Preparation of the Lithographic Base

A lithographic base was prepared as described in example 1.

Preparation of the Heat-mode Imaging Element 3 and 4.

The IR-sensitive layer was coated onto the above described lithographic base from a 5.60% wt solution in ethyl-/butylacetate 58/42 with a wet thickness of 25 μm. The resulting IR-sensitive layer contained 4.3% of carbon black Special Schwarz 250, 7.3% of Naphtoquinondiazide CP3171, 2.0% of Trihydroxybenzoic acid, 5.8% of 3,4,5-trimethoxybenzoic acid, 76.6% of Alnovol PN 452, 0.1% Solsperse 5000, 0.4% Solsperse 28000, 0.4% Nitrocellulose E950 and 3.0% Fluorad FC431. The coating was dried at 110° C.

Exposing the Heat-mode Imaging Element

This material was imaged with a GERBER C42T TM internal drum platesetter at 12,000 rpm (376 m/s, pixel dwell time 0.032 μs) and 2540 dpi. The power level of the laser in the image plane was 4.4 W.

Developing and Printing the Imagewise Exposed Element

After identical exposure of two identical prepared imaging elements, these two elements were developed in an acueous alkaline developing solution as described in Table 2. These developing was carried out in a Technigraph NPX-32 processor filled with the in tabel 2 described developing solution in the developer section, and with water in the rinsing section and Ozasol RC795 gum (commercially available from Agfa) in the gumming section.

The diptime in the developing solution was 44 seconds and the developing temperature was 26° C.

TABLE 2

| Element | 3 | 4 |
|---|---|---|
| Alkaline developer | 1 (85%) | 2 (85%) |
| pH | 13.1 | 13.1 |
| Surface tension | 64 mN/m | 27 mN/m |
| Dmax | 0.38 | 0.35 |
| Dmin | 0.00 | 0.01 |
| Dot rendering (200 lpi) | 3–98 | 5–98 |
| Dot rendering 40% | 40 | 35 |
| Dot rendering 50% | 50 | 44 |
| Dot rendering 70% | 71 | 66 |

During processing the IR-exposed areas are dissolving very rapidly, resulting in a positive working plate. The results on plate with respect to image quality are presented in Table 2.

The element 3 (developed in aqueous alkaline solution with high surface tension) renders the 3% dot on plate while element 4 is able to only render 5% dot.

At the same time in element 4 a clear dot attack was detected over the full range of the screenscale (e.g. 50% dot is rendered only 44%), while this dot attack is not observed with element 3.

The plates were both printed on a Heidelberg GTO46 printing machine with a conventional ink (A B Dick 1020) and fountain solution (Rotamatic), resulting in prints without any scumming in IR-exposed areas and good ink-uptake in the unexposed areas, however the dot rendering on print was favorable for element 3: 3% dot is rendered on print while element 4 only rendered the 5% dot on print.

Example 3

Preparation of the Lithographic Base

A lithographic base was prepared as described in examples 1 and 2.

Preparation of the heat-mode imaging element 5 and 6.

Onto the lithographic base was first coated a layer from a 3% wt solution in tetrahydrofuran/methoxypropanol 57/43, with a wet thickness of 20 μm. The resulting layer contained 88.0% of Alnovol PN452 and 12.0% of 3,4,5-trimethoxybenzoic acid and was dried at 110° C.

Upon this layer was then coated, with a wet coating thickness of 25 μm, the IR-sensitive layer from a 3% wt solution in ethyl-/butylacetate 60/40. The resulting IR-sensitive layer contained 66.0 % of Alnovol PN452, 14.0% of an esterificationproduct of 1,2-Naphtoquinone-2-diazido-5-sulphonylchloride and p-tert.butyl phenol/formaldehyde copolymer (PR12 available from PCAS), 3.8% of Trihydroxybenzoic acid, 8.6% of Special Schwarz 250, 0.9% of Nitrocellulose E950, 0.2% of Solsperse 5000, 0.8% of Solsperse 28000 and 5.7% of Fluorad FC431. This second coating was dried at 120° C.

Imagewise Exposure of the Imaging Element

This material was imaged with a GERBER C42T TM internal drum platesetter at 12,000 rpm (367 m/s, pixel dwell time 0.032 μs) and 2540 dpi. The power level of the laser in the image plane was 4.0 W.

Developing and Printing the Imagewise Exposed Element

After identical exposure of two identical prepared imaging elements, these two elements were developed in an aqueous alkaline developing solution as described in Tale 3. These developing was carried out in a Technigraph NPX-32 processor filled with the in Table 3 described developing solution in the developer section, and with water in the rinsing section and Ozasol RC795 gum (commercially available from Agfa) in the gumming section.

The diptime in the developing solution was 44 seconds and the developing temperature was 26° C.

TABLE 3

| Element | 5 | 6 |
|---|---|---|
| Alkaline developer | 1 | 2 |
| pH | 13.2 | 13.2 |
| Surface tension | 63 mN/m | 28 mN/m |
| Dmax | 0.41 | 0.22 |
| Dmin | 0.00 | 0.00 |
| Dot rendering (200 lpi) | 3–98 | 6–98 |
| Dot rendering 40% | 39 | 35 |
| Dot rendering 50% | 49 | 43 |
| Dot rendering 70% | 71 | 65 |

During processing the IR-exposed areas are dissolving very rapidly, resulting in a positive working plate. The results on plate with respect to image quality are presented in Table 3.

The element 5 (developed in aqueous alkaline solution with high surface tension) renders the 3% dot on plate while element 6 is able to only render 6% dot.

At the same time in element 6 a clear dot attack was detected over the full range of the screenscale (e.g. 50% dot is rendered only 43%), while this dot attack is not observed with element 5.

The plates were both printed on a Heidelberg GTO46 printing machine with a conventional ink (A B Dick 1020) and fountain solution (Rotamatic), resulting in prints without any scumming in IR-exposed areas and good ink-uptake in the unexposed areas, however the dot rendering on print was favorable for element 5: 3% dot is rendered on print while element 6 only rendered the 6% dot on print.

Example 4

Preparation of the Lithographic Base

A lithographic base was prepared as described in examples 1–3.

Preparation of the Heat-mode Imaging Element 7 and 8

The IR-sensitive layer was coated onto the above described lithographic base from a 11% wt solution in tetrahydrofuran/propylene glycol 1-methyl ether 1/1.

The resulting IR-sensitive layer had a coating thickness of 2 μm and contained 6.7% of Carbon black, 70.3% of a cresol-formaldehyde novolak, 3% of 2,4-dihydroxybenzophenone and 20% of an esterification product of 2,3,4-trihydroxybenzophenone and 1,2-naphthoquinone-2-diazido-5-sulphonyl chloride.

The coating was dried for 2 minutes at 100° C.

Exposing the Heat-mode Imaging Element

This material was imaged with a GERBER C42T TM internal drum platesetter at 12,000 rpm (367 m/s, pixel dwell time 0.032 μs) and 2540 dpi. The power level of the laser in the image plane was 4.4 W.

Developing and Printing the Imagewise Exposed Element

After identical exposure of two identical prepared imaging elements, these two elements were developed in an aqueous alkaline developing solution as described in Table 4. These developing was carried out in a Technigraph NPX-32 processor filled with the in Table 4 described developing solution in the developer section, and with water in the rinsing section and Ozasol RC795 gum (commercially available from Agfa) in the gumming section.

The diptime in the developing solution was 22 seconds and the developing temperature 26° C.

TABLE 4

| Element | 7 | 8 |
|---|---|---|
| Alkaline developer | 3 | 4 |
| pH | 13.2 | 13.2 |
| Surface tension | 37 mN/m | 29 mN/m |
| Dmax | 0.92 | 0.89 |
| Dmin | 0.00 | 0.05 |

Alkaline developer 3 comprises sodium silicate (0.3 mole/l) in water and the pH is obtained by adding sodium hydroxide. Alkaline developer 4 is identical with alkaline developer 3 except that the surface tension was obtained by adding octylsulphate.

During processing the IR-exposed areas are dissolving very rapidly, resulting in a positive working plate. The results on plate with respect to image quality are presented in tabel 4. The element 7 (developed in aqueous alkaline solution with higher surface tension) is completely developed (Dmin=0.00) and no scumming arises during printing, while element 8 is not yet completely developed (Dmin =0.05) even when image is already attacked (Dmax is decreased from 0.92 to 0.89.)

The plates were both printed on a Heidelberg GTO46 printing machine with a conventional ink (A B Dick 1020) and fountain solution (Rotamatic), resulting in prints without any scumming using element 7, but using element 8 heavy scumming arised.

What is claimed is:

1. A method for making a lithographic printing plate comprising the steps of a) exposing imagewise to IR-radiation a heat mode imaging element having on a lithographic base with a hydrophilic surface a first layer including a polymer, soluble in an aqueous alkaline solution and a top layer on the same side of the lithographic base as the first layer which top layer is unpenetrable by an alkaline developer and contains a compound capable of converting light into heat, wherein said first layer and said top layer may be one and the same layer; and b) developing said imagewise exposed heat mode imaging element with said alkaline developer whereby the exposed areas of the first and the top layer, which may be the same, are dissolved and the unexposed areas of the first layer remain undissolved characterized in that said alkaline developer has a pH of at least 12 and a surface tension of at least 30 mN/m.

2. A method for making a lithographic printing plate according to claim 1 wherein said alkaline developer contains an alkalimetalsilicate.

3. A method for making lithographic printing plates according to claims 2 wherein said alkalimetalsilicate containing developer comprises $SiO_2$ and $M_2O$ in a molar ratio of 0.5 to 1.5 and a concentration of $SiO_2$ of 0.5 to 6% by weight, $M_2O$ being an alkali metal hydroxide or its oxide.

4. A method for making a lithographic printing plate according to claim 1 wherein said first layer and said top layer are separate layers.

5. A method for making a lithographic printing plate according to claim 4 wherein said top layer comprises an alkali soluble or water soluble polymer as binder.

6. A method for making a lithographic printing plate according to claim 1 wherein said alkali soluble binder is a compound selected from the group consisting of a novolac, polyhydroxystyrene and a carboxy groups containing polymer.

7. A method for making a lithographic printing plate according to claim 1 wherein the first layer comprises a compound selected from the group consisting of low molecular acids and benzophenones.

8. A method for making a lithographic printing plate according to claim 1 wherein the compound capable of converting light into heat is a compound selected from the group consisting of carbon black and I.R. dyes.

9. A method for making a lithographic printing plate according to claim 1 wherein the lithographic base having a hydrophilic surface is an electrochemically grained and anodized aluminium substrate.

10. A method for making a lithographic printing plate according to claim 1 wherein the imaging element after development with the alkaline developer is rinsed with water and/or gummed.

11. A method for making a lithographic printing plate according to claim 1 wherein the imaging element after development with the alkaline developer is baked.

12. A method for making a lithographic printing plate according to claim 1 wherein the pixel dwell time of the laser is comprised between 0.005 and 20 μs.

13. A method for making a lithographic printing plate according to claim 1 wherein the development of said image-wise exposed imaging element is carried out at a temperature between 22 and 35° C.

14. A method for making a lithographic printing plate according to claim 1 wherein the top layer and the first layer are one and the same layer and where this layer comprises as binder an alkali soluble resin.

* * * * *